United States Patent [19]

Yoshimatsu

[11] Patent Number: 5,473,262

[45] Date of Patent: Dec. 5, 1995

[54] POWER SOURCE RESIDUAL CAPACITY MEASURING APPARATUS AND POWER SOURCE APPARATUS HAVING POWER SOURCE CAPACITY MEASURING CIRCUIT

[75] Inventor: Morio Yoshimatsu, Kanagawa, Japan

[73] Assignee: Sony Corporation, Tokyo, Japan

[21] Appl. No.: 229,929

[22] Filed: Apr. 19, 1994

[51] Int. Cl.$^6$ .......................... G01N 27/42; G01N 27/46
[52] U.S. Cl. .............................. 324/771; 324/429; 320/48
[58] Field of Search ................................ 324/771, 430, 324/429, 427; 320/35; 379/382

[56] References Cited

U.S. PATENT DOCUMENTS 4,180,770  12/1979  Eby ........................................... 324/429

Primary Examiner—Kenneth A. Wieder
Assistant Examiner—Barry C. Bowser
Attorney, Agent, or Firm—Ronald P. Kananen

[57] ABSTRACT

According to the invention, there is provided a power source residual capacity measuring apparatus comprising: a circuit for measuring a residual capacity of a power source in accordance with a terminal voltage of the power source; a circuit for detecting a current flowing in a load connected to the power source; and a circuit for correcting the residual capacity of the power source which was measured by the measuring circuit in accordance with the current detection value and characteristics of the power source.

6 Claims, 11 Drawing Sheets

Fig. 12A
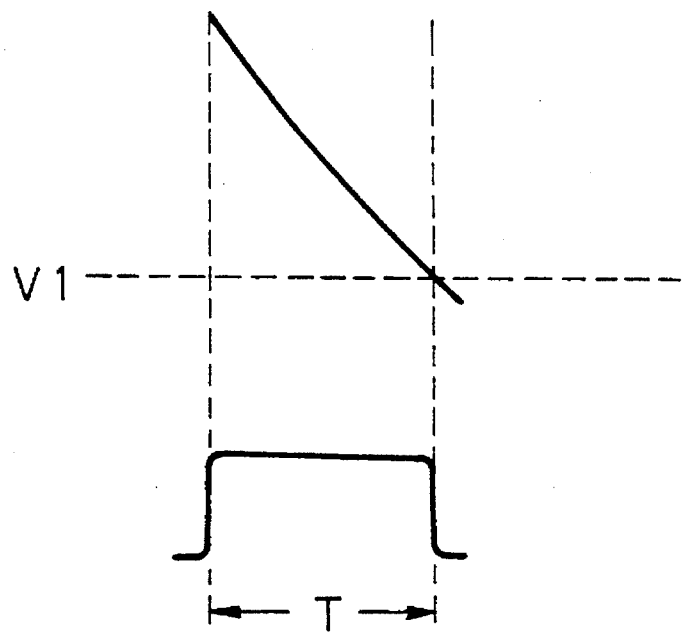
Fig. 12B
Fig. 13
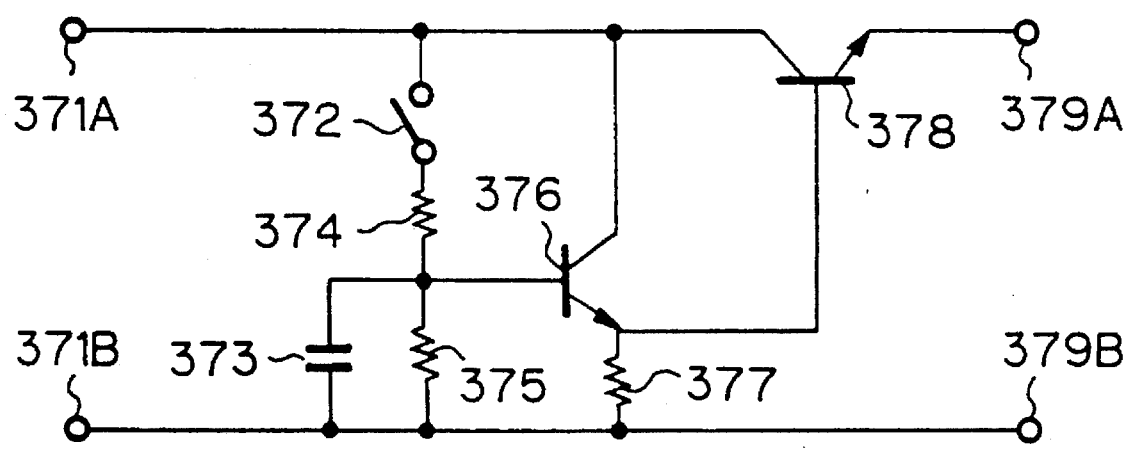

POWER SOURCE RESIDUAL CAPACITY MEASURING APPARATUS AND POWER SOURCE APPARATUS HAVING POWER SOURCE CAPACITY MEASURING CIRCUIT

BACKGROUND OF THE INVENTION

1. Field of the Invention

The invention relates to a power source residual capacity measuring apparatus for detecting a residual capacity of a power source such as primary battery, secondary battery, or the like and also relates to a power source apparatus having a power source residual capacity measuring circuit.

2. Description of the Prior Art

Various types of primary batteries or secondary batteries are installed in a video camera and, mainly, other portable electronic apparatuses.

There is a limitation of a service life of the primary battery installed in such an apparatus. A proper prediction of the service life of the primary battery prevents an erroneous operation of an apparatus using the primary battery, for example, an apparatus such as a video camera or the like and contributes to the effective use of the apparatus. An exchange of the primary battery at a proper timing contributes to the effective use of the primary battery. It is, therefore, desired to properly and accurately predict the service life of the primary battery.

With respect to a secondary battery which can be charged, it is also necessary to properly set the charging timing. In a manner similar to the primary battery, it is desired to properly measure a residual capacity of the secondary battery.

To satisfy such a desire, an apparatus (battery checker) for measuring a residual capacity of a battery such as a dry cell or the like in a non-load state or a predetermined load state has already been known. With reference to the voltage measured by such a battery checker, the user calculates the residual capacity of the primary battery.

An apparatus for integrating a current flowing in a load connected to the battery and for presuming a residual capacity of the battery is also known.

The above voltage measuring apparatus can be realized by a simple circuit construction because it merely detect a battery voltage. Such an apparatus can accurately detect the battery voltage in a predetermined load state or a non-load state.

As shown in FIG. 1, the above voltage measuring method is effective to detect a voltage of a battery in which a change in voltage drop characteristics is typical, for example, a lithium (Li) battery; however, there is a problem such that in case of a battery in which there is hardly a change in voltage drop characteristics until a time point just before the end of the service life, for example, a nickel cadmium (NiCd) battery, there is no voltage change until a time point just before the end of the service life, so that it is difficult to accurately presume the residual capacity from the voltage. In recent years, a battery such as NiCd battery or nickel hydrogen battery in which there is no change in voltage drop characteristics until a time point near the end of the service life of the battery is widely used.

Further, the voltage measuring method causes a phenomenon such that even in case of the same residual capacity, when a load is heavy, the detection voltage is low and, on the contrary, when the load is light, the detection voltage is high. Thus, since the measured voltage fluctuates in dependence on the load state, there is a problem such that the residual capacity of the battery cannot be accurately detected.

On the other hand, according to the current integrating method, since the current flowing in the battery is integrated, the problem in the voltage measuring method mentioned above doesn't occur and the residual capacity of the battery can be calculated. According to the current integrating method, however, the residual capacity of the battery cannot momentarily calculated but must be continuously measured (integrated), so that there is a problem such that a circuit construction to integrate the current becomes complicated. Further, there is also a problem such that when such a circuit is installed in a video camera or the like, its electric power consumption increases.

In the detection of the above residual capacity of the battery mentioned above, it is desired to measure in an apparatus in which the battery is installed, for example, in a state in which the battery is installed in the video camera. In other words, it is desired to remove the battery from the video camera and to measure the residual capacity of the battery in a state in which the battery is connected to the load without using another battery checker. It is requested to reduce the size and costs of the circuit to calculate (measure) the residual capacity of the battery. However, the current integrating method doesn't satisfy such a requirement.

The above problems also similarly occur in another primary battery.

In the secondary battery as well, if the residual capacity can be accurately detected, the battery can be charged at a proper timing. Even in the secondary battery, therefore, it is demanded to accurately detect the residual capacity in a manner similar to the case of the primary battery.

Further, for example, in the case where the secondary battery is detachably installed to the outside of an apparatus like a recent video camera or the like, it is demanded that the user can easily know the residual capacity by the secondary battery itself which was installed to the outside without using the video camera.

Or, in the case where the secondary battery is installed in the video camera or the like, it is demanded that the residual capacity of the battery can be displayed in a view finder or the like of the video camera.

OBJECTS AND SUMMARY OF THE INVENTION

It is, therefore, an object of the present invention to solve the above-mentioned problems and to provide a power source residual capacity measuring apparatus which can accurately measure a residual capacity of a battery or other power sources by a relatively simple circuit construction.

Another object of the invention is to provide a power source apparatus having such a power source residual capacity measuring circuit as mentioned above.

Still another object of the invention is to provide a power source residual capacity measuring apparatus which can display the result of the measurement to a display section of an electronic apparatus in which the display content can be easily seen and a power source is set off.

Further another object of the invention is to provide a power source residual capacity measuring apparatus which can improve an erroneous display of a battery residual capacity upon charging.

According to the invention, there is provided a power source residual capacity measuring apparatus comprising: a circuit for measuring a residual capacity of a power source in accordance with a terminal voltage of the power source; a circuit for detecting a current flowing in a load connected to the power source; and a circuit for correcting the residual capacity of the power source measured in the measuring circuit in accordance with the current detection value and characteristics of the power source.

Preferably, the power source residual capacity measuring apparatus has a circuit for outputting the result of the measurement of the residual capacity of the power source which was corrected.

More preferably, the power source residual capacity measuring apparatus is characterized in that the result of the measurement of the residual capacity is output to a display section of an electronic apparatus in which a power source is installed.

According to the invention, a power source apparatus in which a power source and a power source residual capacity measuring circuit are integrated is provided.

Namely, a power source apparatus of the invention comprises: a power source; a circuit for measuring a residual capacity of the power source in accordance with a terminal voltage of the power source; a circuit for detecting a current flowing in a load connected to the power source; a circuit for correcting the residual capacity of the power source measured in the measuring circuit in accordance with the current detection value and characteristics of the power source; and a circuit for outputting the result of the calculation of the residual capacity of the power source which was corrected.

According to the invention, there is provided a power source residual capacity measuring apparatus comprising: means for displaying a residual capacity of a power source in accordance with a terminal voltage of the power source; display means for displaying the residual capacity of the power source which was measured by measuring means; and charge detecting means for detecting whether the power source is being charged or not, wherein the residual capacity state is displayed by the display means for a period of time during which the power source is not being charged.

Preferably, the apparatus further comprises: switching means for setting whether the residual capacity of the power source is displayed or not; and timer means for detecting the elapse of a predetermined time from the turn-on of the switching means, wherein when the switching means is turned on for a period of time during which the power source is not being charged, a charging state is displayed by the display means for a predetermined time after the turn-on of the switching means.

More preferably, the apparatus further comprises low voltage detecting means for detecting that the terminal voltage of the power source has been set to a low voltage, wherein the terminal of the power source is opened when the terminal voltage of the power source is set to a low voltage.

The above-and other objects and features of the present invention will become apparent from the following detailed description and the appended claims with reference to the accompanying drawings.

BRIEF DESCRIPTION OF THE DRAWINGS

FIGS. 12A and 12B are timing charts which is used in the explanation of the timer circuit;

FIG. 13 is a connection diagram showing another example of a timer circuit;

DETAILED DESCRIPTION OF THE PREFERRED EMBODIMENTS

Figure 1:
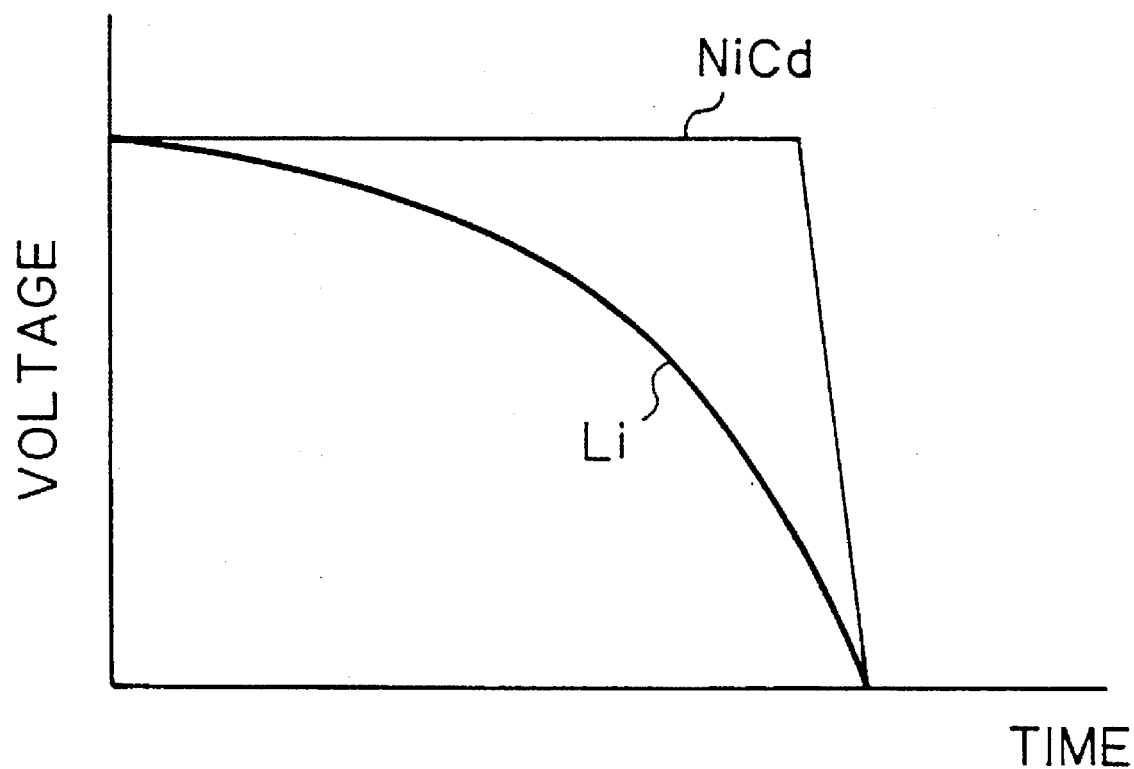
FIG. 1 is a diagram showing a time change of a battery capacity.
Figure 2:
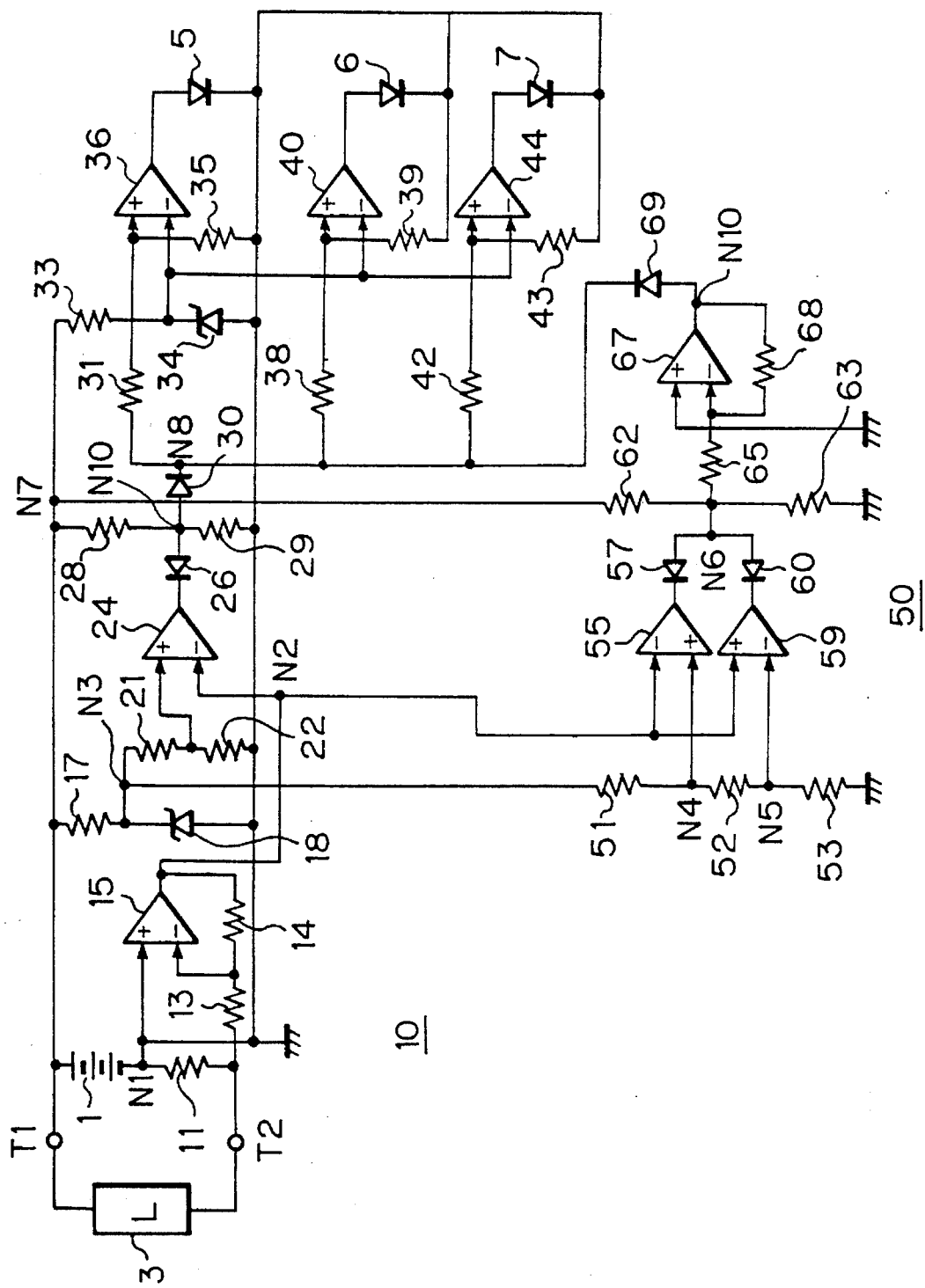
FIG. 2 is a connection diagram showing a battery residual capacity measuring apparatus as a first embodiment of a power source residual capacity measuring apparatus of the present invention.

FIG. 2 shows a circuit construction of a battery residual capacity measuring apparatus for measuring a residual capacity of an NiCd battery as a measuring target according to the first embodiment of a power source residual capacity measuring apparatus of the present invention.

The embodiment will now be described with respect to an example in which a residual capacity of an NiCd battery is measured in a state in which, for instance, it is detachably installed to the outside of a video camera.

In FIG. 2, a battery 1 as a target whose residual capacity is measured, a load 3 which is connected to the battery 1 at terminals T1 and T2, and motors and various kinds of electric (electronic) circuits in, for example, a video camera are arranged. The battery 1 is formed by serially arranging a plurality of NiCd batteries. In order to drive the motor and the like, the battery 1 is constructed as a battery power source of, for instance, 6 V as a whole for driving the video camera.

A circuit construction of the battery residual capacity measuring apparatus will now be described hereinbelow.

The battery residual capacity measuring apparatus comprises a fundamental power source residual capacity detecting circuit 10 and a correcting circuit 50.

The fundamental power source residual capacity detecting circuit 10 detects an approximate value of an electric power capacity of the battery 1 by using a terminal voltage of the battery 1 as a reference. The correcting circuit 50 corrects the above calculated residual electric power capacity in accordance with a state of the load 3 and characteristics of the battery 1, particularly, discharging characteristics of the battery 1.

First, a construction and the operation of the fundamental power source residual capacity detecting circuit 10 will now be described.

A current detecting resistor 11 for detecting a current flowing in the load 3 is serially connected to the battery 1. To reduce an influence by the existence of the resistor 11 as small as possible, a resistance value of the resistor 11 is set to an enough low value for the load 3. For instance, the resistance value of the resistor 11 is set to 20 m $\Omega$. When an initial value of the battery 1 is set to 6 V and a current of 3.3 A as a maximum value and 0.5 A as a standard value flows in the load 3, a terminal voltage of the resistor 11 is equal to 66 mV as a maximum value and 10 mV as a standard value.

A first amplifying circuit is constructed by an input resistor 13, a negative feedback resistor 14, and an amplifier 15. The terminal voltage of the resistor 11 which is set to 66 mV as a maximum value and to 10 mV as a standard value is amplified by the first amplifying circuit to 6.6 V as a maximum value and to 1 V as a standard value.

A Zener diode 18 which is serially connected to a resistor 17 is arranged between the terminal T1 and a node N1. The Zener diode 18 clamps the terminal voltage 6 V of the battery 1 that is applied across the terminal T1 and the node N1 to a predetermined value, for example, 5 V as a lowest level of the voltage measurement of the battery 1, thereby generating at a node N3 a reference voltage which is used to compared with the terminal voltage of the resistor 11.

The voltage 5 V which was clamped by the zener diode 18 is used as a reference, thereby producing a reference voltage for comparison in a comparator, which will be explained hereinlater.

The voltage at the node N3 is divided by series resistors 21 and 22 and is applied to a non-inverting (+) terminal of a comparator 24. The voltage which was clamped to 5 V by the zener diode 18 is dropped to, for example, 1 V by the voltage dividing resistors 21 and 22 and is applied to the non-inverting terminal of the comparator 24.

The terminal voltage of the resistor 11 which was amplified by the first amplifying circuit comprising the resistors 13 and 14 and the amplifier 15 is applied to a node N2 connected to an inverting (−) terminal of the comparator 24. The comparator 24 compares the voltage at the node N2 with the comparison reference voltage which was dropped by the resistors 21 and 22.

As a result of the comparison, when the voltage at the node N2 is lower than the comparison reference voltage as a terminal voltage of the resistor 22, an output signal of the comparator 24 is set to the high level and appears at an output terminal of the comparator 24.

A switching diode 26 is connected to the output terminal of the comparator 24. The anode side of the switching diode 26 is connected to a node N10 as a common connecting point of resistors 28 and 29 which are serially connected between nodes N7 and N1.

The terminal voltage of the battery 1 is applied to the resistors 28 and 29, so that a measurement voltage to measure the voltage of the battery 1 is generated at the node N10.

When the output voltage of the comparator 24 is at the high level, the switching diode 26 generates a high level voltage at the node N10, thereby enabling a fundamental power source capacity of the battery 1 based on the measurement voltage at the node N10 to be measured. When the voltage at the node N2 is higher than the terminal voltage of the resistor 22, the voltage at the node N10 is set to the low level.

A diode 30 for preventing a reverse current is connected between nodes N10 and N8.

A correction voltage, which will be explained hereinlater, is applied to the node N8. In the case where a gain A of the node N10 is set to a reference value 1, a gain B of a comparison amplifier 67 in the correcting circuit 50, which will be explained hereinlater, is set to a value so as to satisfy the relation B=$\alpha$A. $\alpha$ denotes a correction coefficient, which will be explained hereinlater.

The voltage at the node N8 is divided by series resistors 31 and 35 and is applied to a non-inverting terminal of a differential amplifier 36.

A resistor 33 and a Zener diode 34 are connected between the node N7 and the ground line. The voltage which was clamped by the Zener diode 34 is applied to an inverting terminal of the differential amplifier 36.

A light emitting diode (LED) 5 is connected to an output of the differential amplifier 36. When the voltage applied to a non-inverting (+) terminal of the differential amplifier 36 is higher than the clamp voltage of the Zener diode 34, the LED 5 emits a light.

The differential amplifier 36 also functions as a driving circuit of the LED 5.

The voltage at the node N8 is divided by series resistors 38 and 39 and is applied to a non-inverting terminal of a differential amplifier 40. The terminal voltage of the Zener diode 34 is applied to an inverting terminal of the differential amplifier 40.

An LED 6 is connected to an output of the differential amplifier 40. When the voltage applied to the non-inverting terminal of the differential amplifier 40 is higher than the terminal voltage of the Zener diode 34, the LED 6 emits a light.

The differential amplifier 40 also functions as a driving circuit of the LED 6.

The voltage at the node N8 is further divided by series resistors 42 and 43 and is applied to a non-inverting terminal of a differential amplifier 44. The terminal voltage of the Zener diode 34 is applied to an inverting terminal of the differential amplifier 44.

An LED 7 is connected to an output of the differential amplifier 44. When the voltage applied to a non-inverting terminal of the differential amplifier 44 is higher than the terminal voltage of the Zener diode 34, the LED 7 emits a light.

The differential amplifier 44 also functions as a driving circuit of the LED 7.

Resistance ratios of the series resistors 31 and 35, series resistors 38 and 39, and series resistors 42 and 43 are set to different values, respectively. Therefore, although the voltage is commonly applied from the node N8, the comparison voltages which are applied to the non-inverting terminals of the differential amplifiers 36, 40, and 44 are different.

For example, as shown in the following table 1, when the terminal voltage of the battery 1 between the terminal T1 and the node N1 is less than 5 V, the LEDs 5 to are not turned on. When it lies within a range of 5.0 to 5.5 V, only the LED 5 is turned on. When the terminal voltage of the battery 1 lies within a range of 5.5 to 6.0 V, the LEDs 5 and 6 are turned on. When the terminal voltage of the battery 1 is equal to or higher than 6 V, all of the LEDs 5 to 7 are turned on.

TABLE 1

| Terminal voltage of the battery 1 | < 5V | ≧ 5V | ≧ 5.5V | ≧ 6V |
| --- | --- | --- | --- | --- |
| LED5 | OFF | ON | ON | ON |
| LED6 | OFF | OFF | ON | ON |
| LED7 | OFF | OFF | OFF | ON |

As mentioned above, the approximate value of the residual capacity of the battery 1 can be known by a combination of the ON/OFF states of the LEDs 5 to 7.

However, in the circuit construction of only the fundamental power source residual capacity detecting circuit 10 mentioned above, the accuracy of the measurement of the residual capacity of the battery 1 slightly lacks. This is because the terminal voltage of the battery 1, namely, the terminal voltage between the terminal T1 and the node N1 changes in dependence on a magnitude of the load 3 and also changes in accordance with the discharging characteristics of the battery 1. Therefore, since the voltage at the node N8 also changes due to the magnitude of the load 3, the voltage indicative of the residual capacity of the battery 1 cannot be unconditionally determined by comparing the voltage.

Accordingly, the voltage is corrected by the correcting circuit 50, which will be explained hereinlater.

The correcting circuit 50 having: resistors 51, 52, and 53; comparators 55 and 59; switching diodes 57 and 60; resistors 62 and 63; an amplifying circuit which is constructed by an input resistor 65, a negative feedback resistor 68, and an amplifier 67; and a diode 69 for preventing a reverse current is arranged in parallel with the foregoing circuit provided between the nodes N3 and N8 mentioned above.

The terminal voltage of the Zener diode 18 is applied from the node N3 to the resistor 51. The voltage at the node N2 is applied to an inverting input terminal of the comparator 55 and to a non-inverting terminal of the comparator 59.

When the voltage of maximum 5 V appears at the terminal of the Zener diode 18, by properly setting resistance values of the resistors 51, 52, and 53, the voltage 1 V appears at the node N5 and the voltage 2 V appears at the node N4.

When the voltage at the node N2 is equal to or higher than 1 V and is less than 1 V, the voltage at an output terminal of the comparator 55 is set to the high level and the voltage at an output terminal of the comparator 59 is set to the low level.

When the voltage at the node N2 is less than 2 V, the voltage at the output terminal of the comparator 55 is set to the high level and the output terminal of the comparator 59 is set to the high level.

When the voltage at the node N2 is equal to or higher than 2 V, the voltage at the output terminal of the comparator 55 is set to the low level and the voltage at the output terminal of the comparator 59 is set to the high level.

The switching diode 57 having the same function as that of the switching diode 26 is connected to the output terminal of the comparator 55. Similarly, the switching diode 60 is connected to the output terminal of the comparator 59.

Further, a second amplifying circuit comprising the input resistor 65, amplifier 67, and negative feedback resistor 68 is arranged between nodes N6 and N10. The node N10 as an output terminal is connected to the node N8 through the diode 69 for prevention of a reverse current.

When the voltage at the node N6 is set to the high level, a gain of the second amplifying circuit is set as a correction coefficient α to correct the above measured voltage at the node N8. As mentioned above, the correction coefficient α is set to the value to specify the gain B of the second amplifying circuit including the amplifier 67 in case of setting the gain A at the node N10 to 1. The value of α differs in dependence on the discharging characteristics of the battery 1 as a measurement target. Explanation will now be made with respect to an example of an NiCd battery.

A change of a discharge curve due to the load current characteristics of the NiCd battery is shown in the following table 2.

TABLE 2

| Load current | 80%/ coefficient | 50%/ coefficient | 10%/ coefficient |
| --- | --- | --- | --- |
| 0.5A | 6.4/1.0 | 6.3/1.0 | 5.9/1.0 |
| 1.0A | 6.3/1.016 | 6.22/1.013 | 5.87/1.005 |
| 1.5A | 6.1/1.049 | 6.0/1.05 | 5.72/1.031 |
| 2.0A | 5.86/1.092 | 5.76/1.094 | 5.5/1.073 |

From the above table, the following values are set to the correction coefficients α in the amplifying circuit including the amplifier 67 as average values. As mentioned above, the value of the correction coefficient α denotes the correction coefficient α such that when the gain A of the node N10 is set to 1.0, the gain B of the second amplifying circuit including the amplifier 67 is set to the following values.

TABLE 3

| Load current | Correction coefficient |
| --- | --- |
| 0.5–1.0 A | 1.006 |
| 1.0–1.5 A | 1.027 |
| 1.5–2.0 A | 1.065 |
| 2.0A or more | 1.086 |

In the battery residual capacity measuring apparatus shown in FIG. 2, only the correction within a range of 0.5 to 1.0 A is executed in the second amplifying circuit having the amplifier 67.

According to the above circuit construction, an approximate value of the residual capacity of the battery 1 is calculated on the basis of the terminal voltage of the battery 1. Further, the calculated value of the residual capacity of the battery 1 is corrected on the basis of the current flowing in the load 3 and the discharging characteristics of the battery 1. Therefore, in a state in which the battery is connected to the load 3, the residual capacity of the battery 1 can be accurately detected independent of the state of the load 3.

A circuit construction of the battery residual capacity measuring apparatus shown in FIG. 2 is relatively simple and is suitable to realize an integrated circuit excluding the LEDs 5 to 7 and can be easily assembled in the video camera or the like.

When embodying the invention, the correcting circuit 50 can be constructed so as to execute the above correction by four levels shown in Table 3 or by more levels. In such a case, a plurality of LEDs for displaying the residual capacity are provided.

By correcting at a plurality of levels, the residual capacity of the battery 1 can be further accurately detected.

Particularly, since the state in which the current decreases at a location near the end of the service life of the battery 1 is accurately detected, for example, a voltage of 1.0 A or less is divided into a plurality of levels and a correction similar to that mentioned above can be executed. In this case, a plurality of circuits each having a construction similar to the correcting circuit 50 shown in FIG. 2 are provided.

The tables 2 and 3 show the characteristics values in the case where another battery using Ni, for example, an NiCd battery is used as a battery 1. The invention, however, can be also applied to a nickel hydrogen battery or the like. When the kind of battery 1 differs, its discharging characteristics also differ, so that a proper coefficient according to the characteristics of the battery is used. By performing an adjustment of the constant or the like according to the battery as a measurement target, the power source residual capacity measuring apparatus of the invention is not limited to the kind of battery but can be applied to the measurement of the residual capacities of various kinds of batteries.

Figure 3:
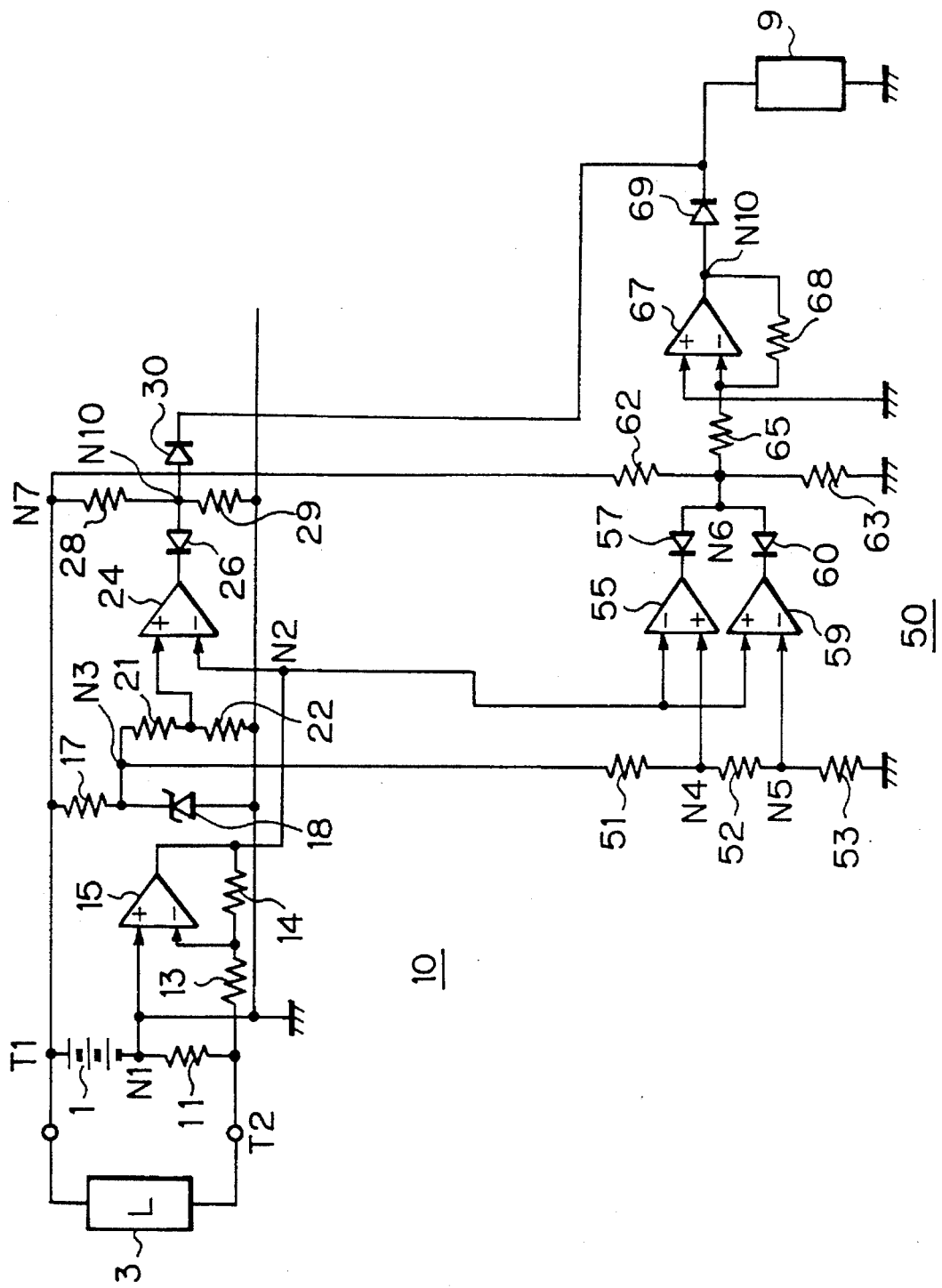
FIG. 3 is a connection diagram of a battery residual capacity measuring apparatus as a second embodiment of a power source residual capacity measuring apparatus of the invention.

FIG. 3 shows a circuit construction of a battery residual capacity measuring apparatus as a second embodiment of the power source residual capacity measuring apparatus of the invention.

According to the embodiment, in place of displaying the schematic residual capacity of the battery 1 by the LEDs 5 to 7 shown in FIG. 2, a display 8 to more accurately continuously display the residual capacity of the battery 1 is provided in the video camera.

Like an ordinary photometer of a camera, a meter which oscillates by a needle in proportion to the voltage at the node N10 can be used as a display 8.

A liquid crystal display can be also used in place of the display 8 like a meter or the LEDs 5 to 7 mentioned above. In this case, a circuit to detect the voltage at the node N10 and a liquid crystal display to continuously display a detection value can be assembled in a video camera.

Figure 6A:
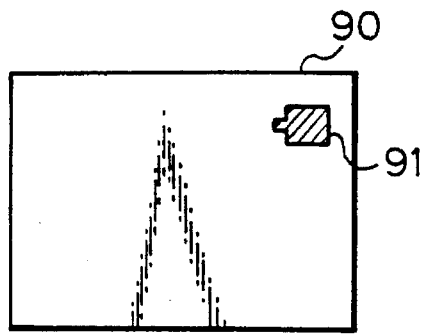
FIGS. 6A, 6B and 6C are diagrams showing an example in which a measured residual capacity is displayed in a view finder of a video camera as a display example of the power source residual capacity measuring apparatus of the invention.
Figure 6B:
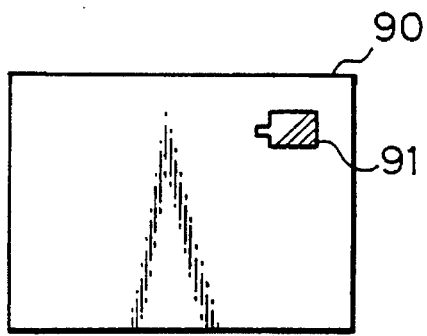
Figure 6C:
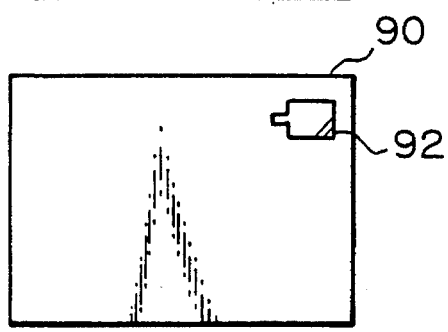

As a liquid crystal display example, as shown in FIG. 6, the residual capacity of the battery 1 can be also displayed in a corner portion 91 of a view finder 90 as a liquid crystal display section of the video camera by a size of area of such a portion. When the user depresses a "battery check button (not shown)" of the video camera, the residual capacity is displayed in the view finder 90 for a period of time during which the button is depressed. In the example, FIG. 6A shows a state in which the residual capacity of the battery 1 is sufficient. FIG. 6C shows a state in which the residual capacity is small.

As another display method to display the residual capacity to a liquid crystal display, for example, the residual capacity of the battery 1 is displayed by a level like a bar chart.

As mentioned above, the residual capacity of the battery 1 can be also output in a continuous form.

Figure 4:
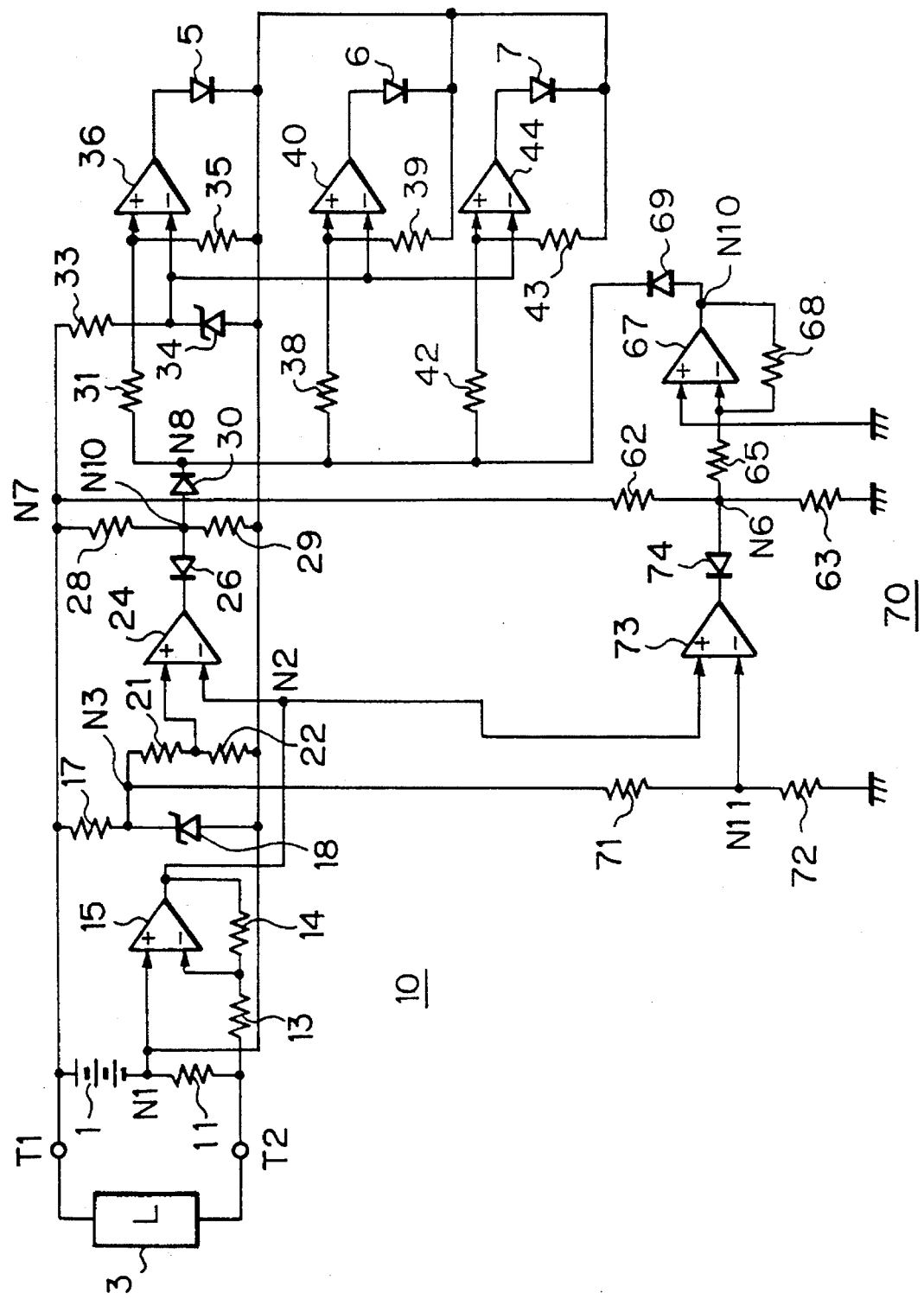
FIG. 4 is a connection diagram of a battery residual capacity measuring apparatus as a third embodiment of a power source residual capacity measuring apparatus of the invention.

FIG. 4 shows a circuit construction of a battery residual capacity measuring apparatus in the second embodiment of the power source residual capacity measuring apparatus of the invention.

The battery residual capacity measuring apparatus shown in FIG. 4 is obtained by simplifying the correcting circuit. 50 shown in FIG. 2.

Ordinarily, in case of harmonizing the simplification of the circuit construction and the degree of measuring precision, as for the detection of the residual capacity of the battery, it is important how to accurately detect the residual capacity at a time point near the end of service life of the battery. For this purpose, it is effective to accurately measure the residual capacity of the battery 1 in a critical state in which the current flowing in the load 3 decreases and the battery can be used with a reliability rather than the detection of the residual capacity of the battery 1 in a new state in which the residual capacity of the battery is sufficient.

The battery residual capacity measuring apparatus shown in FIG. 4 has a circuit construction to accomplish the above object.

A correcting circuit 70 shown, in FIG. 4 comprises: series resistors 71 and 72; a comparator 73; a switching diode 74; the voltage dividing resistors 62 and 63; the amplifier 67; the negative feedback resistor 68; the input resistor 65; and the diode 69 for prevention of a reverse current.

The voltage which is obtained by dividing the voltage at the node N3 appears at a node N11 and is used as a reference voltage to compare with the voltage at the node N2. The reference voltage is set to, for instance, 3 V which is higher than the voltage 1 V at the node N2. On the other hand, the terminal voltage of the resistor 22 is set to 2 V.

A correction gain of the amplifier 67 in the correcting circuit 70 in the example is set to an average value, for example, 1.06 within a range of 1 to 3 V.

In the example, the voltage appearing at the node N2 is corrected to a value within a range of 1 to 3 V in accordance with the load 3 and the discharging characteristics of the battery 1.

Figure 5:
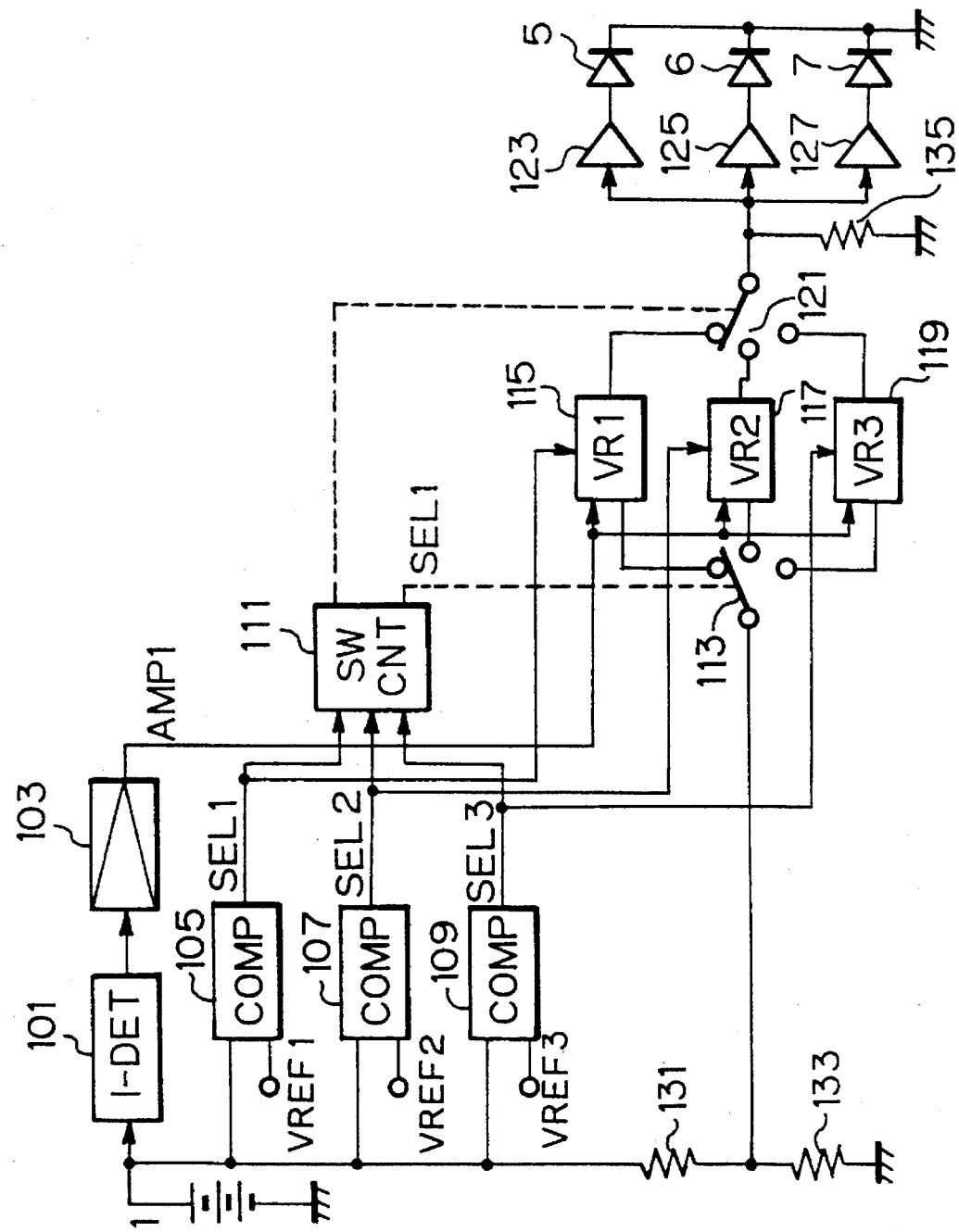
FIG. 5 is a block diagram of a battery residual capacity measuring apparatus as a fourth embodiment of a power source residual capacity measuring apparatus of the invention.

FIG. 5 shows a circuit construction of a battery residual capacity measuring apparatus as a fourth embodiment of the power source residual capacity measuring apparatus of the invention.

Although the load 3 is not shown in the circuit shown in FIG. 5, the load 3 is connected to the battery 1 as shown in FIG. 2.

In the battery residual capacity measuring apparatus, as shown in the diagram, there are connected a current detecting circuit 101, an amplifying circuit 103, voltage dividing resistors 131 and 133, comparing circuits 105, 107, and 109, a switching control circuit 111, a first switching circuit 113, variable resistors 115, 117, and 119, a second switching circuit 121, amplifying circuits 123, 125, and 127, a resistor 135, and the LEDs 5, 6, and 7.

The current detecting circuit 101 and amplifying circuit 103 correspond to the first amplifying circuit having the current detecting circuit 11 and amplifier 15 shown in FIG. 2, respectively.

The comparing circuits 105, 107, and 109 receive the terminal voltage of the battery 1 and compare with reference voltages REF1, REF2, and REF3 of different values, respectively. When it is detected that the voltage of the battery 1 is higher than the reference voltage, each comparing circuit generates a high level output signal. For example, a selection signal SEL1 at the high level is generated from the comparing circuit 105.

The switching control circuit 111 drives the switching circuits 113 and 121 on the basis of the selection signal SEL1, thereby allowing the first variable resistor 115 to be selected.

The variable resistor 115, the resistors 131, 133, and 135 construct a voltage dividing circuit.

A resistance value of the variable resistor 115 changes in accordance with a value of an amplification output AMP1 from the amplifier 103. Thus, a terminal voltage of the resistor 135 changes in accordance with the value of the variable resistor 115.

Therefore, in a manner similar to the above correcting circuits 50 and 70, the resistance value of the variable resistor 115 changes in accordance with the load current of the batter 1 which was detected by the current detecting circuit 101, thereby correcting a terminal voltage of the resistor 135.

The terminal voltage of the resistor 135 is applied to the amplifying circuits 123, 125, and 127. When output levels of those amplifying circuits are equal to or higher than driving levels of the LEDs 5 to 7 connected to those amplifying circuits, the corresponding LEDs emit lights.

In a manner similar to the above, the residual capacity of the battery 1 can be discriminated in accordance with the ON/OFF states of the LEDs 5 to 7.

In place of the displays of the LEDs 5 to 7, an apparatus which can continuously display the terminal voltage of the resistor 135, for example, a display apparatus similar to the display 8 shown in FIG. 3 can be used.

The reason why the three variable resistors 115, 117, and 119 are provided is because, since change ranges of the variable resistors are limited to a certain extent, the resistance values are made variable in accordance with the voltage of the battery 1.

An example of a power source apparatus of the invention will now be explained.

Figure 7:
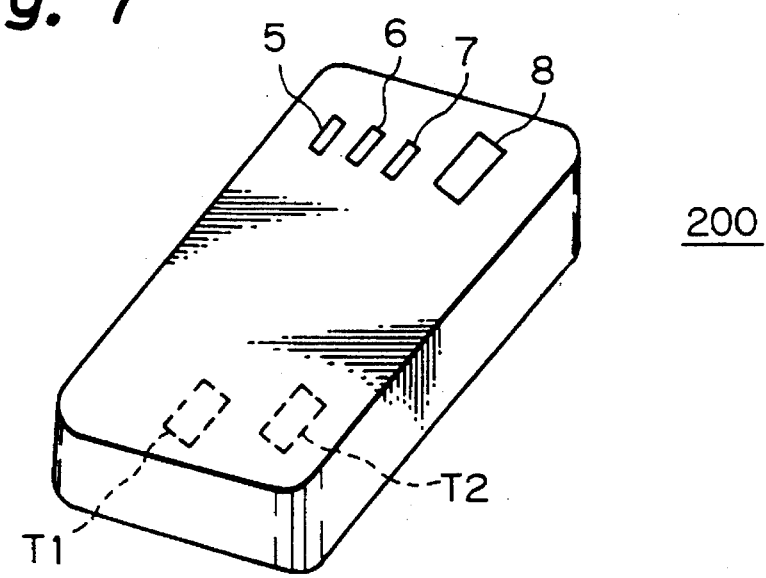
FIG. 7 is an external perspective view of a power source apparatus of the invention.

FIG. 7 shows an example of a power source apparatus 200 of the invention.

An NiCd battery and a power source residual capacity measuring circuit are provided in the power source apparatus 200. A battery check switching 8 and the LEDs 5 to 9 are provided on the upper side of the outer surface. Terminals T1 and T2 are provided on the back side.

When the terminals T1 and T2 on the back side of the power source apparatus 200 are connected to the video camera, they are connected to electric terminals of the video camera, so that the upper side can be seen from the user.

Figure 8:
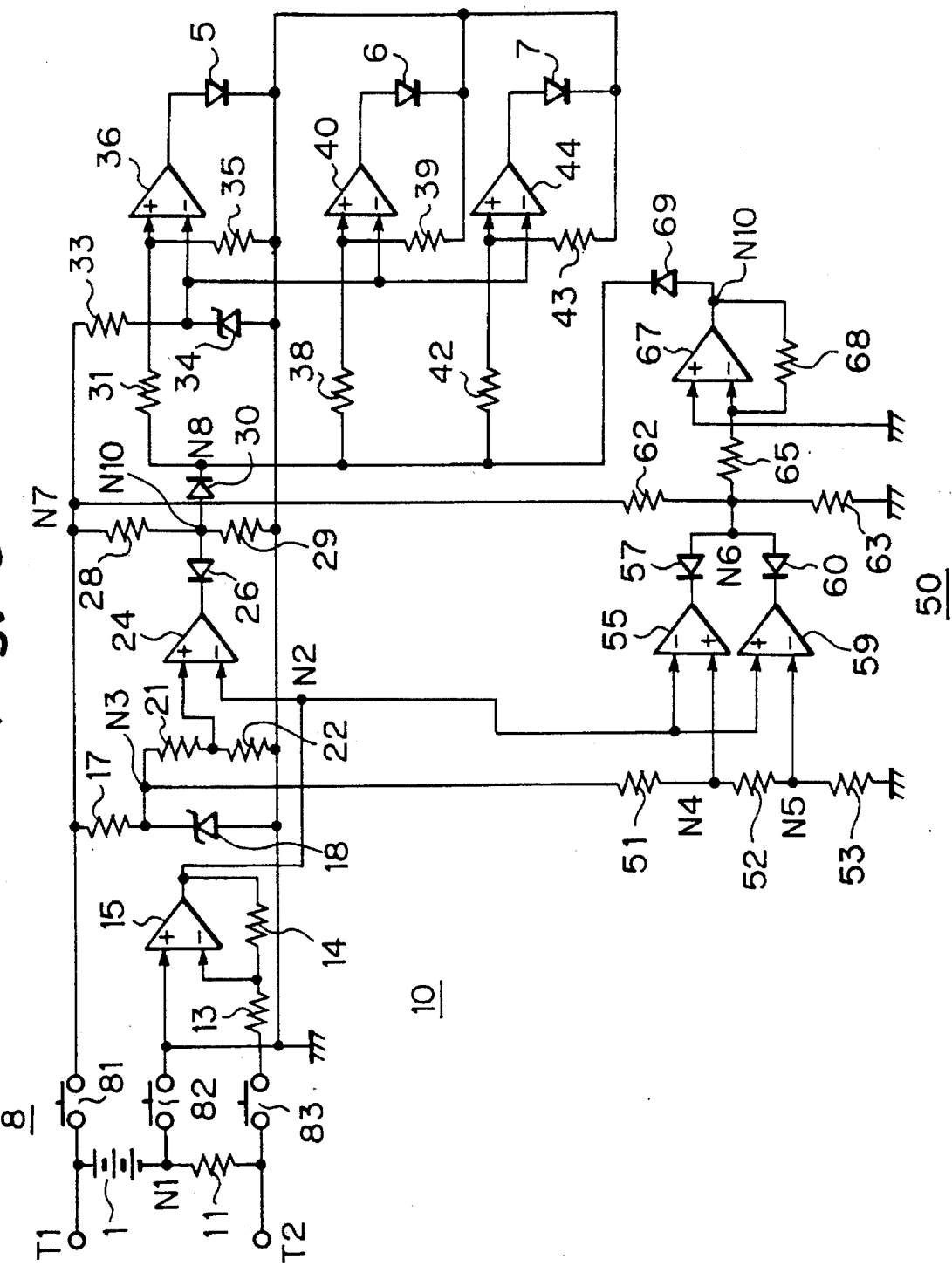
FIG. 8 is a connection diagram of a power source residual capacity measuring circuit built in the power source apparatus.

The battery 1 and a power source residual capacity measuring circuit shown in FIG. 8 which has a circuit construction similar to that shown in FIG. 2 and is used to measure the residual capacity of the battery 1 are built in the power source apparatus 200.

The circuit of FIG. 8 is almost similar to the power source residual capacity measuring apparatus shown in FIG. 2. However, the power source residual capacity measuring circuit similar to that shown in FIG. 2 is made operative or inoperative by the ON/OFF state of the battery check switching 8. That is, only when the user depresses the battery check switching 8, the residual capacity of the battery 1 is displayed by the LEDs 5 to 7. The fundamental operation of the power source residual capacity measuring circuit is similar to that of the power source residual capacity measuring apparatus which has already been described with reference to FIG. 2.

In the circuit construction shown in FIG. 8, since the power source residual capacity measuring circuit is made operative only when the battery check switching 8 is depressed, the reduction of the service life of the battery 1 by the battery check is prevented.

By providing the battery residual capacity measuring circuit into the power source apparatus 200 as mentioned above, the user can easily confirm the residual capacity of the battery 1 from the outside of the video camera. When using the power source apparatus having such a power source residual capacity measuring circuit therein, by merely attaching the power source apparatus to various kinds of electronic apparatuses without considering application conditions for the video camera or the like, the self residual capacity can be confirmed.

Figure 9:
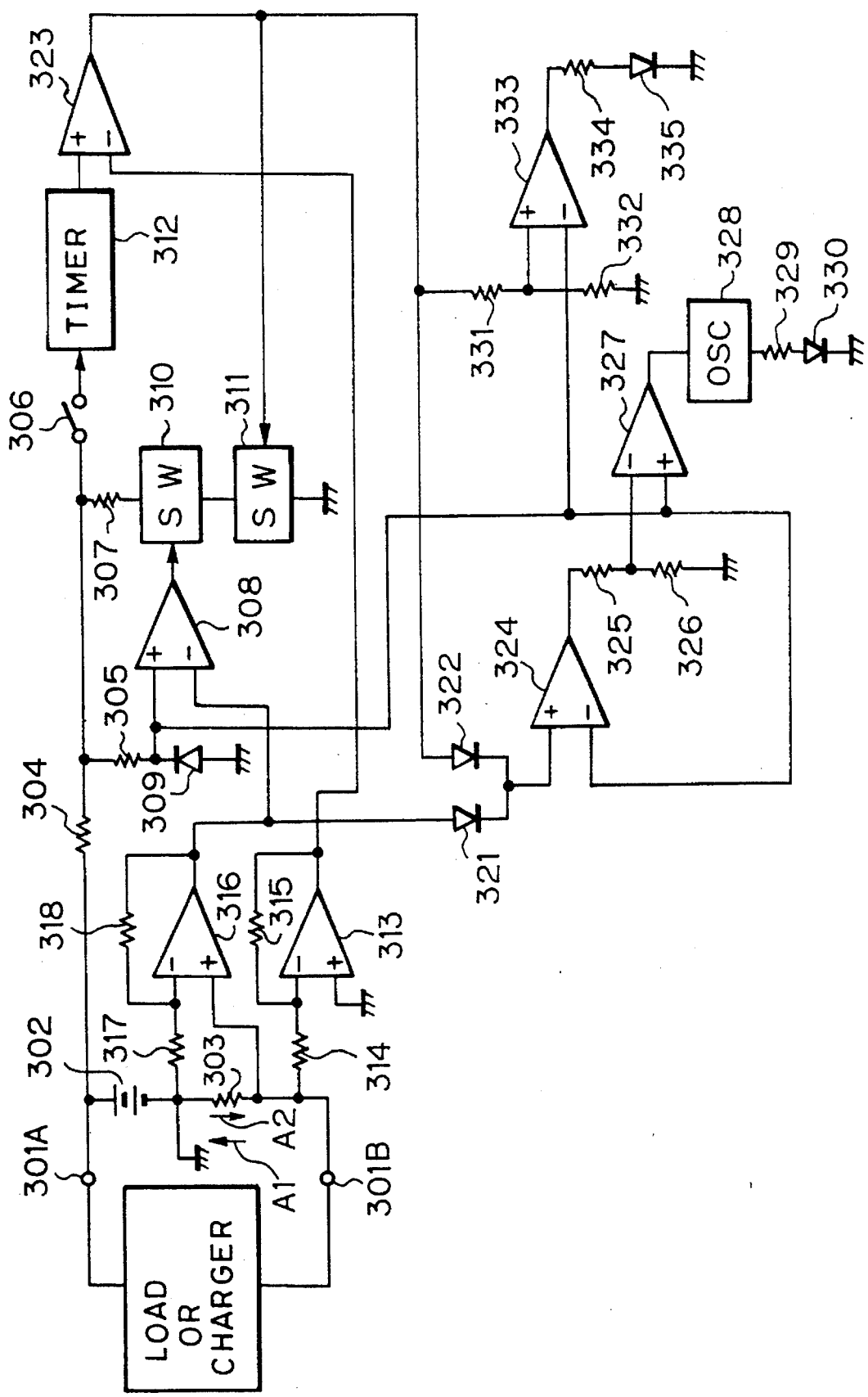
FIG. 9 is a circuit diagram of a battery residual capacity measuring apparatus as a fifth embodiment of a power source residual capacity measuring apparatus of the invention.

FIG. 9 shows the fifth embodiment of the invention.

The terminal voltages of the battery in the charging and discharging modes change in accordance with different characteristics. Therefore, if a proper correction is not executed in the charging and discharging modes, an error increases. The fifth embodiment intends to improve an erroneous display of a residual capacity of a battery upon discharging.

In FIG. 9, reference numerals 301A and 301B denote electrode terminals of the positive and negative polarities of a battery 302. A load or a charger is connected between the terminals 301A and 301B. The negative polarity of the battery 302 is connected to the ground. A resistor 303 for current detection is connected between the battery 302 and the terminal 301B. For example, a nickel cadmium (Ni—Cd) battery is used as a battery 302.

One end of a resistor 304 for correction is connected to the terminal 301A. The other end of the resistor 304 is connected to a resistor 305 and one end of a resistor 307 for correction and is also connected to one end of a switch 306. The other end of the switch 306 is connected to an input terminal of a timer circuit 312. An output terminal of the timer circuit 312 is connected to a non-inverting input terminal of an operational amplifier 323.

The other end of the resistor 305 is connected to a non-inverting input terminal of an operational amplifier 308. A Zener diode 309 is connected between the other end of the resistor 305 and the ground. A connecting point of the resistor 305 and the Zener diode 309 is connected to the non-inverting input terminal of the operational amplifier 308 and is also connected to inverting input terminals of operational amplifiers 327 and 333. A series circuit of switching circuits 310 and 311 is connected between the other end of the resistor 307 and the ground.

The terminal 301B is connected to a non-inverting input terminal of an operational amplifier 313 constructing a charge detecting circuit through a resistor 314. The non-inverting input terminal of the operational amplifier 313 is connected to the ground. A resistor 315 is connected between the operational amplifier 313 and its inverting input terminal.

The terminal 301B is connected to a non-inverting input terminal of an operational amplifier 316 constructing a discharging circuit. An inverting input terminal of the operational amplifier 316 is connected to the ground through a resistor 317. A resistor 318 is connected between an output terminal of the operational amplifier 316 and its inverting input terminal.

An output of the operational amplifier 316 is connected to an inverting input terminal of the operational amplifier 308 and is also connected to an anode of a diode 321. An output terminal of the operational amplifier 308 is connected to a switch control terminal of the switching circuit 310.

An output terminal of the operational amplifier 313 is connected to an inverting input terminal of the operational amplifier 323. An output terminal of the operational amplifier 323 is connected to a switch control terminal of the switching circuit 311 and is also connected to an anode of a diode 322. A series connection of resistors 331 and 332 is connected between the output terminal of the operational amplifier 323 and the ground.

Cathodes of the diodes 321 and 322 are connected to a non-inverting input terminal of an operational amplifier 324. The inverting input terminal of the operational amplifier 324 is connected to a connecting point of the resistor 305 and the Zener diode 309. A series connection of resistors 325 and 326 is connected between an output terminal of the operational amplifier 324 and the ground. A connecting point of the resistors 325 and 326 is connected to a non-inverting input terminal of the operational amplifier 327.

An output terminal of the operational amplifier 327 is connected to an oscillating circuit 328. An output terminal of the oscillating circuit 328 is connected to an anode of a light emitting diode (LED) 330 through a resistor 329. A cathode of the LED 330 is connected to the ground.

A connecting point of the resistors 331 and 332 is connected to a non-inverting input terminal of the operational amplifier 333. An output terminal of the operational amplifier 333 is connected to an anode of an LED 335 through a resistor 334. A cathode of the LED 335 is connected to the ground.

When the apparatus is left, since no current flows in the resistor 303 for current detection, no output is derived from the operational amplifier 316 constructing a discharge detecting circuit and from the operational amplifier 313 constructing a charge detecting circuit. Therefore, the operational amplifier 308 generates a high level output and the switching circuit 310 is turned on.

When the switch 306 for checking is turned on, the terminal voltage of the battery 302 is generated for a predetermined time through the timer circuit 312. The terminal voltage of the battery 302 is obtained from a connecting point of the resistors 325 and 326 through the operational amplifier 323, diode 322, and operational amplifier 324. In this instance, since the output of the operational amplifier 323 is set to the high level, the switching circuit 311 is turned on and the other end of the resistor 307 is connected to the ground. Therefore, the terminal voltage of the battery 302 which is detected is corrected by the resistors 304 and 307. The terminal voltage is supplied to one input terminal of the operational amplifier 327.

The Zener diode 309 generates a reference voltage. The reference voltage is supplied to the other input terminal of the operational amplifier 327. The terminal voltage of the battery 302 is compared with the reference voltage by the operational amplifier 327. When the battery capacity is sufficient in a state in which the battery is left, since the terminal voltage of the battery 302 is equal to or higher than a predetermined value, the output of the operational amplifier 327 is set to the high level. The light emitting diode 330 flickers.

When the capacity of the battery in the leaving state is small, the terminal voltage of the battery 302 is equal to or lower than the predetermined value, so that the output of the operational amplifier 327 is set to the low level and the LED 330 is lit off. After the elapse of a predetermined time, the output of the operational amplifier 323 is set to the low level by the timer circuit 312 and the LED 330 is lit off.

When the switch 306 is turned on, the terminal voltage of the battery 302 is generated from a connecting point of the resistors 331 and 332. The output signal at the connecting point of the resistors 331 and 332 is supplied to the non-inverting input terminal of the operational amplifier 333. The reference voltage is supplied to the inverting input terminal of the operational amplifier 333. Therefore, the LED 335 is lit on for a predetermined time after the turn-on of the switch 306.

The operation upon discharging will now be described. When discharging, a load is connected between the terminals 301A and 301B. When the load is connected as mentioned above, a current flows in the current detecting resistor 303 in the direction shown by an arrow A1. Therefore, the output level of the operational amplifier 316 constructing the discharge detecting circuit is set to the high level and a state in which the battery is being discharged can be detected. In this instance, the output of the operational amplifier 313 for detection of the charging is set to the low level. Since the output of the operational amplifier 316 is set to the high level, the output of the operational amplifier 308 is set to the low level and the switching circuit 310 is turned off.

The output of the operational amplifier 316 is detected from a connecting point of the resistors 325 and 326 through the diode 321 and the operational amplifier 324. The output of the operational amplifier 316 is compared with the reference voltage by the operational amplifier 327. When the battery capacity is large, the output level of the operational amplifier 316 increases, so that the output of the operational amplifier 327 is set to the high level and the LED 330 flickers. When the battery capacity upon discharging is small, the output of the operational amplifier 327 decreases and the LED 330 is lit off.

The operation upon charging will now be described. When charging, a charger is connected between the terminals 301A and 301B. When the charger is connected between the terminals 301A and 301B as mentioned above, a current flows in the current detecting resistor 303 in the direction shown by an arrow A2. Therefore, the output level of the operational amplifier 313 constructing the charge detecting circuit is set to the high level and a state in which the battery is being charged can be detected. In this instance, the output of the operational amplifier 316 constructing the discharge detecting circuit is set to the low level. When the output of the operational amplifier 313 is set to the high level, the output of the operational amplifier 323 is set to the low level and a low level signal is supplied to the diode 322. When the output of the operational amplifier 316 is set to the low level, the low level signal is given to the diode 321. Therefore, upon charging, the residual capacity displaying operation is stopped and the LEDs 330 and 335 are always lit off.

As mentioned above, when the battery is left, the LED 330 is lit on or flickers for a predetermined time after the turn-on of the switch 306 in accordance with the residual capacity of the battery. The LED 335 is lit on or off. Upon discharging, when the residual capacity of the battery is equal to or less than a specified value, the LED 330 automatically flickers. The same operation as that upon discharging is executed for a predetermined time after the turn-on of the switch 306.

When the battery is charged, the residual capacity displaying operation of the battery is stopped. As for the battery characteristics upon charging of the battery, although the correction according to the characteristics to correctly display the residual capacity is complicated, according to the embodiment of the invention, since the residual capacity display operation of the battery is stopped upon charging of the battery, it is possible to prevent that the user erroneously recognizes the battery capacity.

Figure 10:
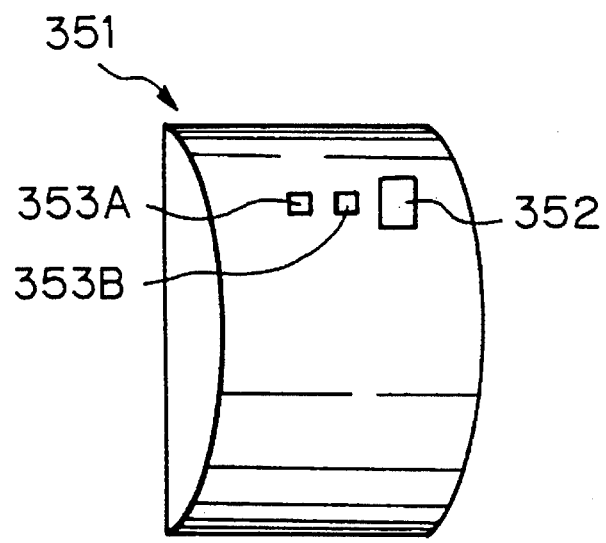
FIG. 10 is an external perspective view of another example of a power source apparatus of the invention.

FIG. 10 shows another example of a power source apparatus. A switch 352 for checking and light emitting diodes (LEDs) 353A and 353B are arranged on the rear surface of a battery 351. The switch 352 for checking corresponds to the switch 306 and the LEDs 353A and 353B correspond to the LEDs 330 and 331.

As mentioned above, when the battery 351 is left, the LED 353A is lit on or flickers for a predetermined time after the turn-on of the switch 352. If the battery capacity is sufficient, the LED 353B is lit on for such a period of time. When the battery 351 is connected to a load, if the battery capacity is equal to or less than a specified value, the LED 353B flickers for such a period of time. When a charger is connected to the battery 351 and the battery is in a charging state, the LEDs 353A and 353B are lit off irrespective of the battery capacity or the state of the switch 306.

In the embodiment, by providing the timer circuit 312, when the battery is left, the residual capacity is displayed for only a predetermined time after the turn-on of the switch 306 and the residual capacity is not displayed after the elapse of a predetermined time. Such a timer circuit 312 can be constructed, for example, as shown in FIG. 11.

Figure 11:
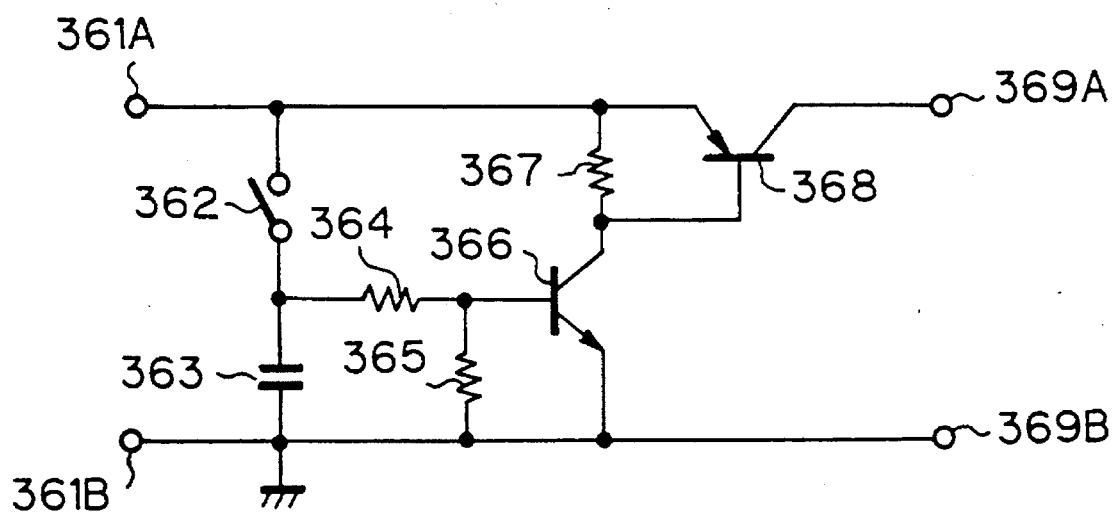
FIG. 11 is a connection diagram of an example of a timer circuit.

FIG. 11 shows an example of the timer circuit 312. In FIG. 11, a positive polarity voltage of the battery is applied to a terminal 361A. A terminal 361B is connected to the ground. A series circuit of a switch 362 and a capacitor 363 is connected between the terminals 361A and 361B. A series circuit of resistors 364 and 365 is connected between the ground and a connecting point of the switch 362 and the capacitor 363. A connecting point of the resistors 364 and 365 is connected to a base of an NPN type transistor 366. An emitter of the transistor 366 is connected to the ground. A collector of the transistor 366 is connected to the terminal 361A through a resistor 367 and to a base of a PNP type transistor 368. An emitter of the transistor 368 is connected to the terminal 361A. A collector of the transistor 368 is connected to a terminal 369A. A terminal 369B is connected to the ground.

When the switch 362 is turned on, a charging current rapidly flows in the capacitor 363 and a terminal voltage of the capacitor 363 is rapidly increased. When the terminal voltage of the capacitor 363 rises, a base voltage of the transistor 366 also rises and the transistor 366 is turned on. When the transistor 366 is turned on, a base voltage of the transistor 368 drops and the transistor 368 is turned on. When the transistor 368 is turned on, a circuit between the terminals 361A and 369A is made conductive.

When the switch 362 is turned off, the charges of the capacitor 363 are gradually discharged through the resistors 364 and 365. Therefore, the terminal voltage of the capacitor 363 is gradually reduced. Thus, the base voltage of the transistor 366 is slowly decreased as shown in FIG. 12A. When the base voltage of the transistor 366 drops to a threshold voltage V1 or less, the transistor 366 is turned off. When the transistor 366 is turned off, the base voltage of the transistor 368 rises and the transistor 368 is turned off. Therefore, a circuit between the terminals 361A and 369A is disconnected. As shown in FIG. 12B, consequently, a circuit between the terminals 361A and 369A can be made conductive for only a predetermined period of time T after the turn-on of the switch 362.

FIG. 13 shows another example of a timer circuit. In FIG. 13, a positive polarity voltage of the battery is applied to a terminal 371A. A terminal 371B is connected to the ground. A series circuit of a switch 372 and resistors 374 and 375 is connected between the terminals 371A and 371B. A capacitor 373 is connected between the ground and a connecting point of the resistors 374 and 375. A connecting point of the resistors 374 and 375 is connected to a base of an NPN type transistor 376. A collector of the transistor 376 is connected to the terminal 371A. An emitter of the transistor 376 is connected to the ground through a resistor 377 and to a base of an NPN type transistor 378. A collector of the transistor 378 is connected to the terminal 371A. An emitter of the transistor 378 is connected to a terminal 379A. A terminal 379B is connected to the ground.

In the example of FIG. 13, the PNP type transistor 368 in the example shown in FIG. 11 is replaced to the NPN type transistor 378. The operation principle is similar to that of the example shown in FIG. 11.

Figure 14:
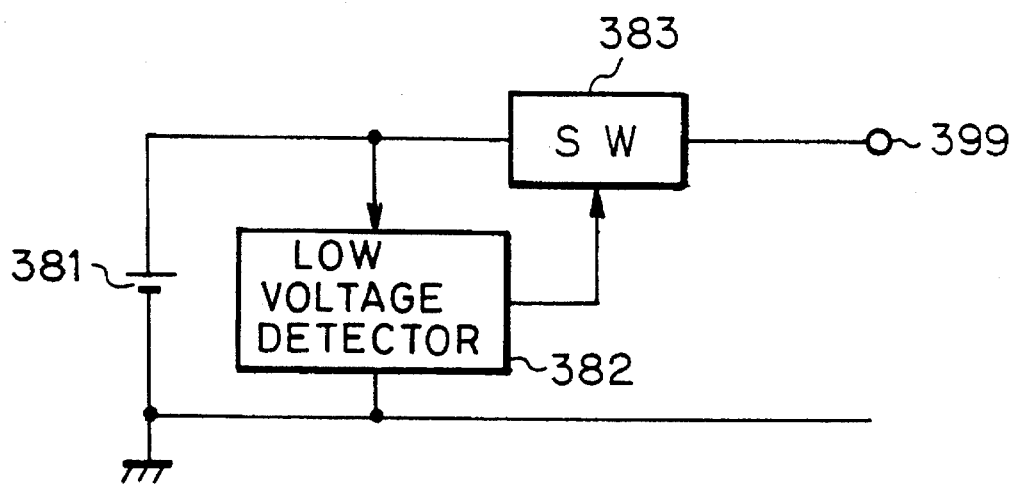
FIG. 14 is a block diagram showing an example of a low voltage shut-off circuit.

In the battery having the capacity display function as mentioned above, when the capacity of the battery is detected for a long time in a state in which the battery capacity hardly remains, there is a danger of the occurrence of an overdischarge of the battery. As shown in FIG. 14, therefore, whether a voltage of a battery 381 is low or not is detected by a low voltage detecting circuit 382. A switching circuit 383 is controlled by a detection output of the detecting circuit 382. When the voltage of the battery 381 is low, it is effective to disconnect a circuit between the battery 381 and a terminal 399. In this case, as shown in FIG. 15, a reference low voltage can be formed by resistors instead of a zener diode.

Figure 15:
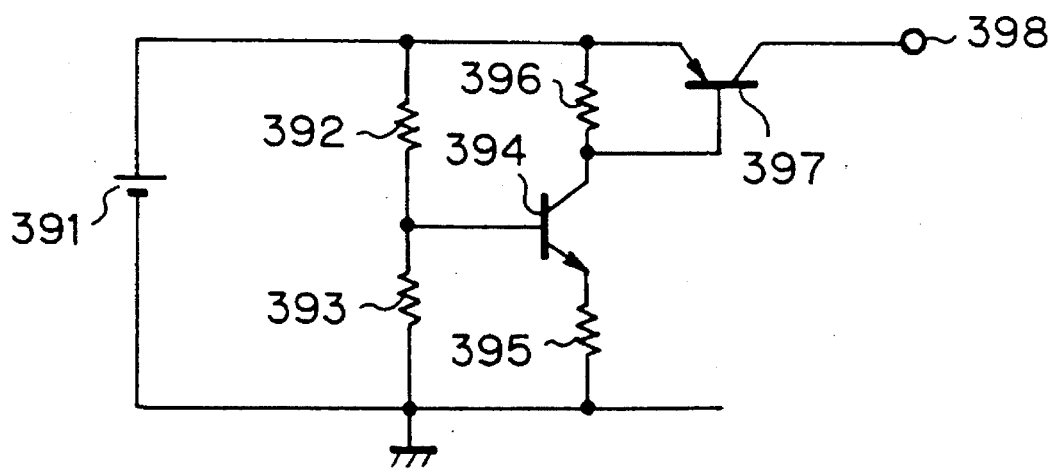
FIG. 15 is a connection diagram of an example of the low voltage shut-off circuit.

In FIG. 15, a series circuit of resistors 392 and 393 is connected between the positive and negative polarities of a battery 391. The negative polarity of the battery 391 is connected to the ground. The connecting point of the resistors 392 and 393 is connected to a base of an NPN type transistor 394. An emitter of the transistor 394 is connected to the ground through a resistor 395. A collector of the transistor 394 is connected to the battery 391 through a resistor 396 and is also connected to a base of a PNP type transistor 397. An emitter of the transistor 397 is connected to the battery 391. A collector of the transistor 397 is connected to a terminal 398.

When the voltage of the battery 391 decreases, the voltage drops at a connecting point of the resistors 392 and 393, so that the transistor 394 is turned off. When the transistor 394 is turned off, a base voltage of the transistor 397 rises and the transistor 397 is turned off. Therefore, when the voltage of the battery 391 decreases, a circuit between an electrode of the battery 391 and the terminal 398 is disconnected.

The present invention is not limited to the foregoing embodiments but many modifications and variations are possible within the spirit and scope of the appended claims of the invention.

What is claimed is:

1. A power source residual capacity measuring apparatus comprising:

means for measuring a residual capacity of a power source in accordance with a terminal voltage of the power source;

means for detecting a current flowing in a load connected across said power source; and means for correcting a residual capacity of the power source which was measured by said measuring means in accordance with the current detection value and characteristics of said power source.

2. An apparatus according to claim 1, further comprising means for outputting the result of the measurement of said corrected residual capacity of the power source.

3. An apparatus according to claim 2, wherein said residual capacity measurement result is output to a display section of an electronic apparatus to which said power source is installed.

4. A power source apparatus comprising:

a power source; and power source residual capacity measuring means having means for measuring a residual capacity of said power source in accordance with a terminal voltage of the power source, means for detecting a current flowing in a load connected across the power source, means for correcting the residual capacity of the power source which was measured by said measuring means in accordance with said current detection value and characteristics of the power source, and means for outputting the result of the calculation of said corrected residual capacity of the power source.

5. A power source residual capacity measuring apparatus comprising:

means for measuring a residual capacity of a power source in accordance with a terminal voltage of said power source;

display means for displaying the residual capacity of the power source which was measured by said measuring means; and charge detecting means for detecting whether the battery is being charged or not, wherein a residual capacity state of the power source is displayed by said display means for a period of time during which the power source is not charged;

switch means for setting whether a residual capacity of the power source is displayed or not; and timer means for detecting the elapse of a predetermined time after the turn-on of said switch means, wherein when the switch means is turned on for a period of time during which the power source is not charged, the residual capacity state of the power source is displayed by said display means for said predetermined time after the turn-on of the switch means.

6. An apparatus according to claim 5, further comprising low voltage detecting means for detecting that the terminal voltage of the power source decreased, and wherein when said terminal voltage of the power source decreases, a terminal of the power source is opened.

* * * * *